(12) United States Patent
Chan

(10) Patent No.: US 10,277,224 B2
(45) Date of Patent: Apr. 30, 2019

(54) BOOTSTRAP DIODE EMULATOR CIRCUIT

(71) Applicant: Mosway Technologies Limited, Hong Kong (CN)

(72) Inventor: On Bon Peter Chan, Hong Kong (CN)

(73) Assignee: Mosway Technologies Limited, Hong Kong (CN)

( * ) Notice: Subject to any disclaimer, the term of this patent is extended or adjusted under 35 U.S.C. 154(b) by 0 days.

(21) Appl. No.: 15/840,043

(22) Filed: Dec. 13, 2017

(65) Prior Publication Data

US 2018/0167065 A1 Jun. 14, 2018

Related U.S. Application Data

(60) Provisional application No. 62/433,900, filed on Dec. 14, 2016.

(51) Int. Cl.
*H03B 1/00* (2006.01)
*H03K 17/567* (2006.01)
*H03K 17/06* (2006.01)
*H03K 17/687* (2006.01)
*H03K 17/30* (2006.01)

(52) U.S. Cl.
CPC .......... *H03K 17/567* (2013.01); *H03K 17/06* (2013.01); *H03K 17/687* (2013.01); *H03K 2017/307* (2013.01); *H03K 2017/6875* (2013.01); *H03K 2217/0018* (2013.01); *H03K 2217/0081* (2013.01)

(58) Field of Classification Search
CPC .. H02M 3/1588; H02M 3/158; H02M 3/1584; Y02B 70/1466
See application file for complete search history.

(56) References Cited

U.S. PATENT DOCUMENTS

| 5,666,280 | A | 9/1997 | Janaswamy et al. |
| 7,215,189 | B2 | 5/2007 | Wilhelm |
| 2010/0103709 | A1* | 4/2010 | Tofigh ............... H02M 7/217 363/127 |
| 2013/0187160 | A1* | 7/2013 | Li ..................... H01L 27/098 257/57 |

* cited by examiner

Primary Examiner — Sibin Chen
(74) Attorney, Agent, or Firm — Leydig, Voit & Mayer

(57) ABSTRACT

A bootstrap diode emulator circuit having a cathode and an anode includes a transistor device and a diodic device. The transistor device is arranged at the cathode of the bootstrap diode emulator circuit. The diodic device has a cathode connected to the transistor device and an anode that is the anode of the bootstrap diode emulator circuit.

22 Claims, 9 Drawing Sheets

BOOTSTRAP DIODE EMULATOR CIRCUIT

TECHNICAL FIELD

The invention relates to a bootstrap diode emulator circuit and in particular, but not exclusively, to a bootstrap diode emulator semiconductor circuit.

BACKGROUND

FIG. 1A shows a circuit diagram 10 of the L6390 high voltage half bridge driver integrated circuit manufactured by STMicroelectronics. As shown in FIG. 1A, the circuit 10 includes a built-in bootstrap diode 12 (labeled as "bootstrap driver") arranged between the low side supply voltage node VCC and the bootstrap supply voltage node BOOT, for connection with a bootstrap capacitor (not shown). FIG. 1B illustrates circuit connection of part of the L6390 high voltage half bridge driver integrated circuit 10 with an external bootstrap diode $D_{BOOT}$ and other external electrical components for realizing a bootstrap driver.

In the circuit 20 of FIG. 1B, during normal operation, energy is transferred from the low side power supply with nodes VCC and GND to high side supply decoupling capacitor $C_{BOOT}$ 24 between nodes BOOT and OUT, via the bootstrap diode $D_{BOOT}$ 22. However, in some applications it is preferable to integrate the bootstrap diode in the half-bridge driver integrated circuit for simplifying the application circuit. Generally, such integration requires a diode with high reverse breakdown voltage that is normally not available in typical integrated circuit process technology platforms. Accordingly, one solution is to use a diode emulator circuit having a high voltage device such as high voltage LDMOS device to emulate the function of a diode.

FIG. 1C illustrates circuit connection of part of the L6390 high voltage half bridge driver integrated circuit 10 with a built-in emulated bootstrap diode 32 and other external electrical components for realizing a bootstrap driver. The emulated bootstrap diode 32 includes a high voltage DMOS device arranged to be driven synchronously with the low-side driver (LVG) and connected with a diode in series. In the circuit 30 of FIG. 1C, during normal operation, energy is transferred from the low side power supply with nodes VCC and GND to high side supply decoupling capacitor $C_{BOOT}$ 34 between nodes BOOT and OUT, via the emulated bootstrap diode 32.

FIG. 2 shows another exemplary diode emulator circuit 40. The circuit 40 includes a high voltage LDMOS device 42. A source terminal of the device 42 is connected to the low side supply voltage node VCC; a drain terminal of the device 42 is connected to the bootstrap supply voltage node BOOT; and a gate terminal of the device 42 is connected with a low-side driver. The diode emulator circuit 40, while operable as a bootstrap diode, suffers from the following problems:

(1) An internal bootstrap gate driver circuit is required to enable a full (maximum) VCC voltage to reach the bootstrap capacitor $C_{BOOT}$.

(2) The emulated diode can conduct only when the low side circuit is turned on.

In particular, the second problem means that proper initialization will be required before the high voltage half bridge integrated circuit can enter into normal functional modes. This issue can be addressed if a high voltage LDMOS device with an isolated body is present such that the body is connected to the source terminal of the high voltage LDMOS device 42 instead of to COM. Problematically, however, such a device is not readily available in most high voltage integrated circuit process platforms.

U.S. Pat. No. 5,666,280 and U.S. Pat. No. 7,215,189 further disclose some existing bootstrap diode emulator circuits. These circuits are typically operable with half-bridge driver integrated circuits.

It is an object of the invention to address the above needs, to overcome or substantially ameliorate the above disadvantages or, more generally, to provide a new or otherwise improved bootstrap diode emulator circuit.

SUMMARY OF THE INVENTION

In accordance with a first aspect of the invention, there is provided a bootstrap diode emulator circuit, comprising: a transistor device arranged at a cathode of the bootstrap diode emulator circuit; and a diodic device with a cathode connected to the transistor device and an anode forming an anode of the bootstrap diode emulator circuit The anode of the bootstrap diode emulator circuit may be connected to the low side supply voltage node VCC and the cathode of the bootstrap diode emulator circuit may be connected to the bootstrap supply voltage node BOOT.

Preferably, the transistor device is a high-voltage device and the diodic device is a medium-voltage device.

Preferably, the diodic device has a minimum reverse breakdown voltage larger than a difference between the magnitude of the threshold voltage and the minimum voltage at the anode of the bootstrap diode emulator circuit.

Preferably, a magnitude of a threshold voltage below which the transistor device is turned-off is larger than a maximum voltage received at the anode of the bootstrap diode emulator circuit.

Preferably, the transistor device comprises or is a JFET device and the threshold voltage is a pinch-off voltage of the JFET device. The gate terminal of the JFET device may be grounded. The source terminal of the JFET device may be connected directly with the diodic device.

In one embodiment of the first aspect, the diodic device can be formed by a diode or an emulated diode device In one embodiment of the first aspect, the emulated diode device comprises a semiconductor switch.

In one embodiment of the first aspect, the emulated diode device comprises a PMOS device with a body diode connected between its drain and source terminals. Preferably, gate and source terminals of the PMOS device are connected directly with each other. Alternatively, the bootstrap diode emulator circuit further comprises one or both of: a resistor connected between gate and source terminals of the PMOS device and a gate control circuit connected with the gate terminal of the PMOS device.

In one embodiment of the first aspect, the emulated diode device comprises an NMOS device with a body diode connected between its drain and source terminals. Preferably, gate and source terminals of the NMOS device are connected directly with each other. Alternatively, the bootstrap diode emulator circuit further comprises a gate control circuit connected with the gate terminal of the NMOS device.

In one embodiment of the first aspect, the emulated diode device comprises a diode-connected transistor. Preferably, the diode-connected transistor comprises a PNP bipolar transistor with its base and collector terminals connected directly with each other. Alternatively, the diode-connected transistor comprises a NPN bipolar transistor with its base and collector terminals connected directly with each other.

Preferably, the bootstrap diode emulator circuit is integrated in an integrated circuit, such as an integrated circuit chip.

In accordance with a second aspect of the invention, there is provided a bootstrap circuit comprising the bootstrap diode emulator circuit of the first aspect and a capacitor operably connected with the bootstrap diode emulator circuit.

In accordance with a third aspect of the invention, there is provided an integrated circuit comprising the bootstrap diode emulator circuit of the first aspect.

In accordance with a fourth aspect of the invention, there is provided a half-bridge driver circuit comprising the bootstrap diode emulator circuit of the first aspect.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 3:
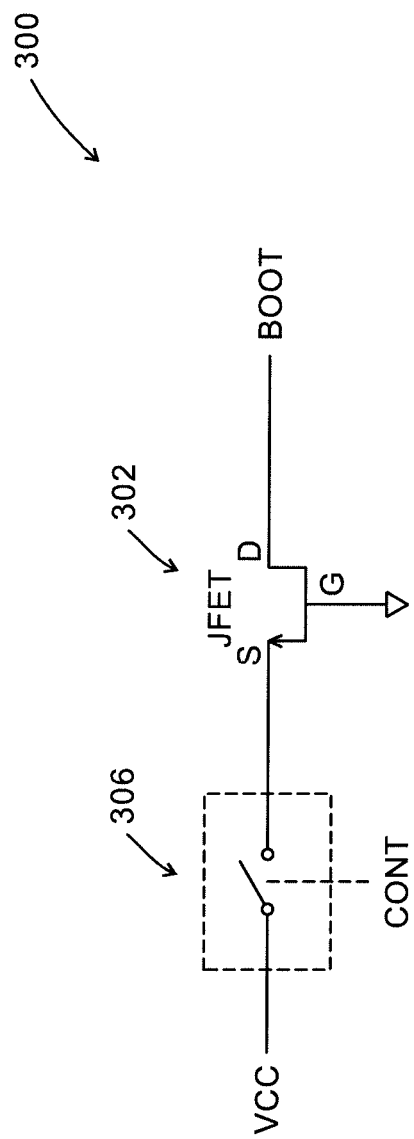
FIG. 3 is a schematic circuit diagram of a bootstrap diode emulator circuit in one embodiment of the invention.

FIG. 3 shows a bootstrap diode emulator circuit 300 in one embodiment of the invention. The circuit 300 generally includes a transistor device 302 and a diodic device in the form of a switching device 306. The transistor device 302 is a high voltage JFET device. A source terminal of the JFET device 302 is connected with the switching device; a gate terminal of the JFET device 302 is connected to ground; a drain terminal of the JFET device 302 is connected to bootstrap supply voltage node BOOT. The switching device 306 is connected between low side supply voltage node VCC and the source terminal of the JFET device. In order to allow the full (maximum) voltage at node VCC to be passed to node BOOT, the magnitude of the pinch off voltage of the JFET device is larger than the maximum voltage at node VCC. In this embodiment, the switching device 306 connected at the source terminal is a medium voltage device. The minimum reverse breakdown voltage of the medium voltage device 306 is larger than the difference between magnitude of the pinch off voltage of the JFET device 302 and the minimum voltage at node VCC. In one example, switching control can easily be implemented by using a medium voltage semiconductor device such as a medium voltage MOSFET.

Figure 4:
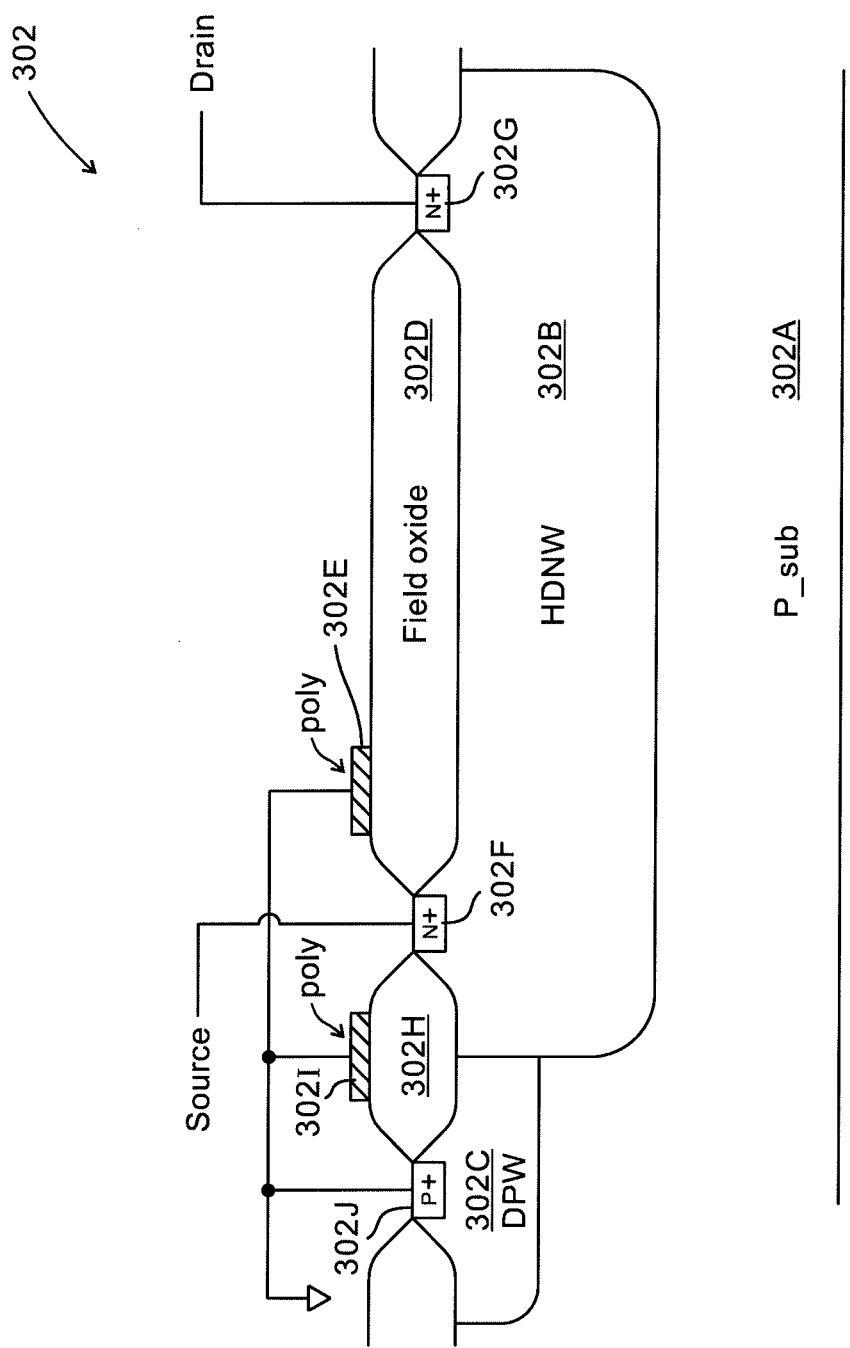
FIG. 4 is a cross-sectional schematic diagram of the high voltage JFET device in FIG. 3 in one embodiment of the invention.

FIG. 4 shows a cross-section of the high voltage JFET device 302 in FIG. 3. As shown in FIG. 4, the device 302 includes a p-type silicon substrate 302A, a high voltage n-well region 302B on the p-type silicon substrate 302A, and a deep p-well region 302C on the p-type silicon substrate 302A and adjacent the p-type silicon substrate 302A. A first field oxide layer 302D is arranged on the high voltage n-well region 302B. A grounded poly layer 302E is arranged on the first field oxide layer 302D. Two n+ regions 302F, 302G are arranged at two ends of the first field oxide layer 302D, and they form the source and drain terminals respectively. A second field oxide layer 302H is arranged above both the high voltage n-well region 302B and deep p-well region 302C, connecting with the two. Another grounded poly layer 302I is arranged on the second field oxide layer 302H. A p+ region 302J, grounded, is arranged at one end of the second field oxide layer 302H. The other end of the second field oxide layer 302H is connected with the n+ region 302F at one end of the first field oxide layer 302D.

Various modifications may be made to the JFET device 302 shown in FIG. 4 to provide other embodiments of the invention. For example, in one embodiment, a PTOP layer may be added at the silicon surface below the first field oxide layer 302D, between the source and the drain n+ terminals 302F and 302G, with appropriate separation from both terminals 302F and 302G. In another embodiment, a n+ buried layer may be added below the high voltage n-well region 302B at the position beneath the drain n+ terminal 302G.

Figure 5:
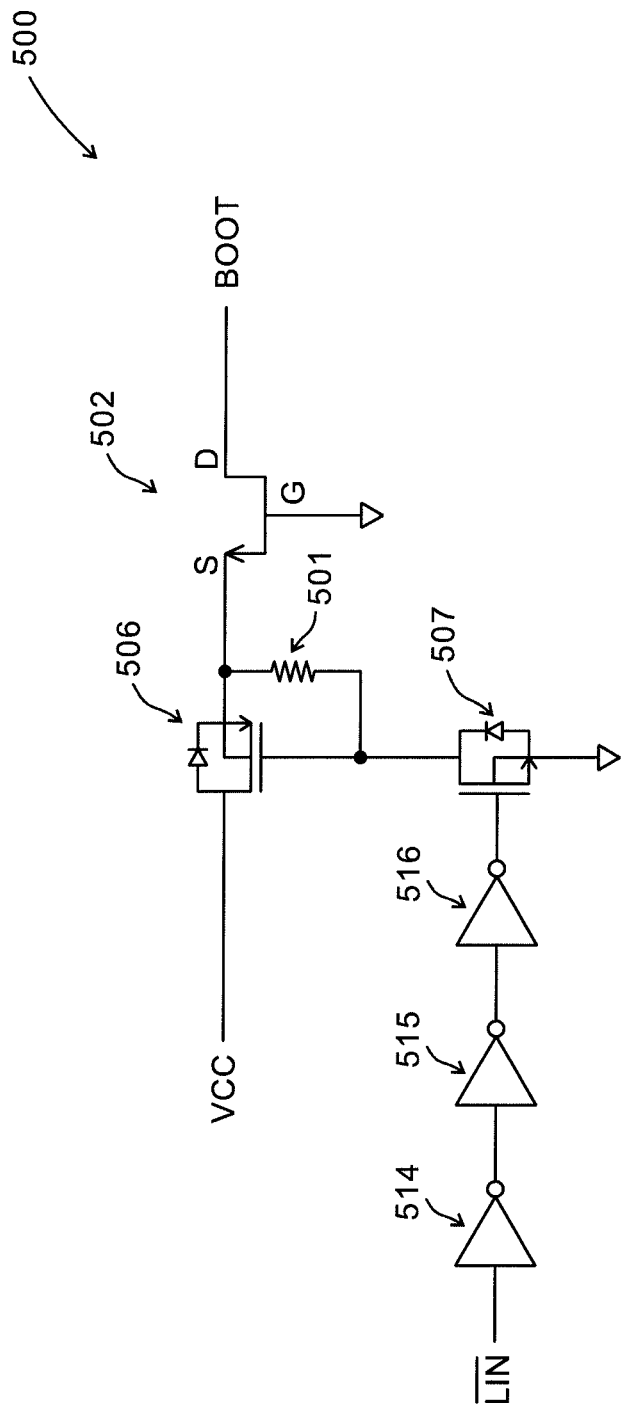
FIG. 5 is circuit diagram of a specific implementation of the bootstrap diode emulator circuit of FIG. 3 in one embodiment of the invention.

FIG. 5 shows a specific implementation of the bootstrap diode emulator circuit 300 of FIG. 3 in one embodiment of the invention. In the circuit 500 of FIG. 5, the switching device 306 in FIG. 3 is implemented with a medium voltage PMOS device 506 with a body diode connected between its source and drain terminals. A self-bias resistor 501 is connected between the gate and source terminals of the PMOS device 506. A gate control circuit is connected to the gate terminal of the PMOS device 506. The source terminal of the PMOS device 506 is connected with a high voltage JFET device 502 such as the one as described with respect to FIG. 3. The drain terminal of the PMOS 506 is connected to VCC. The gate control circuit includes a medium voltage NMOS device 507 with a body diode connected between its source and drain terminals. The drain terminal of the NMOS device 507 is connected to the gate terminal of the PMOS device

506. The source terminal of the NMOS device 507 is connected to COM (or ground). The gate terminal of the NMOS device 507 is connected to the $\overline{\text{LIN}}$ input, via three series-connected inverters 514-516.

In operation of the circuit 500 of FIG. 5, when the $\overline{\text{LIN}}$ input signal is high, the NMOS device 507 is turned off. The self-bias resistor 501 keeps the gate-source voltage VGS of the PMOS device 506 at zero and hence turns the PMOS device 506 off. Due to the existence of the body diode between the source and drain terminals of the PMOS device 506, when voltage at node BOOT is more than a diode drop below voltage at node VCC, current can still pass from node VCC to node BOOT (in the same way as if an external bootstrap diode is present).

On the other hand, when the $\overline{\text{LIN}}$ input signal is low (i.e. with the low side driver on and hence OUT=zero V), the NMOS device 507 is turned on to pull its drain potential to COM. The gate-source voltage VGS of the PMOS device 506 becomes −VCC. This turns on the PMOS device 506 to provide an additional low resistance path for charging up the node BOOT from node VCC, while allowing voltage at node BOOT to reach a maximum voltage appearing at node VCC.

Figure 1A:
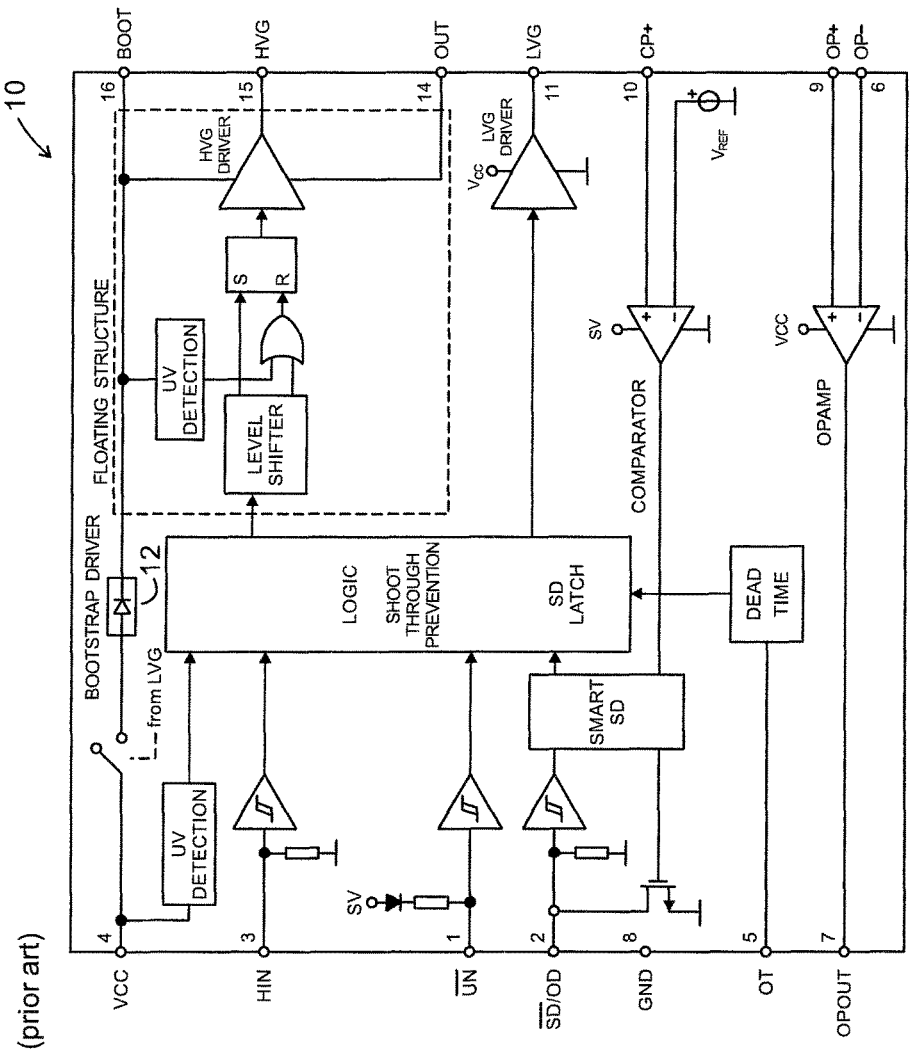
FIG. 1A is a block diagram of the L6390 high voltage half bridge driver integrated circuit manufactured by STMicroelectronics.
Figures 1B, 1C:
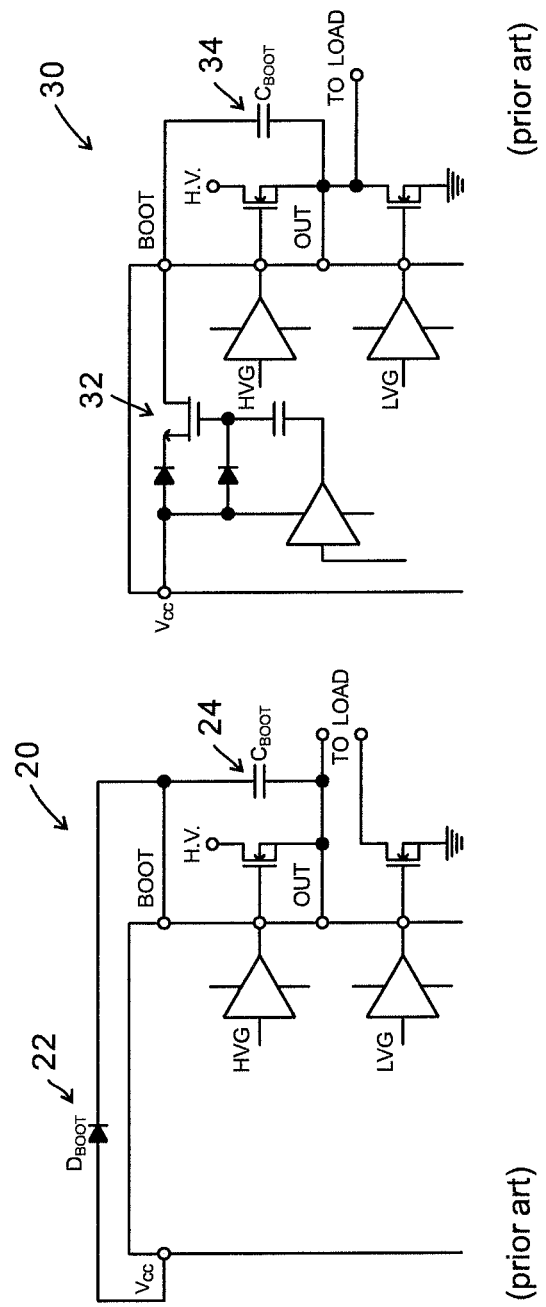
FIG. 1B is a circuit diagram of a bootstrap driver circuit implemented using the L6390 high voltage half bridge driver integrated circuit manufactured by STMicroelectronics and other external components.
FIG. 1C is a circuit diagram of another bootstrap driver circuit implemented using the L6390 high voltage half bridge driver integrated circuit manufactured by STMicroelectronics and other external components.
Figure 2:
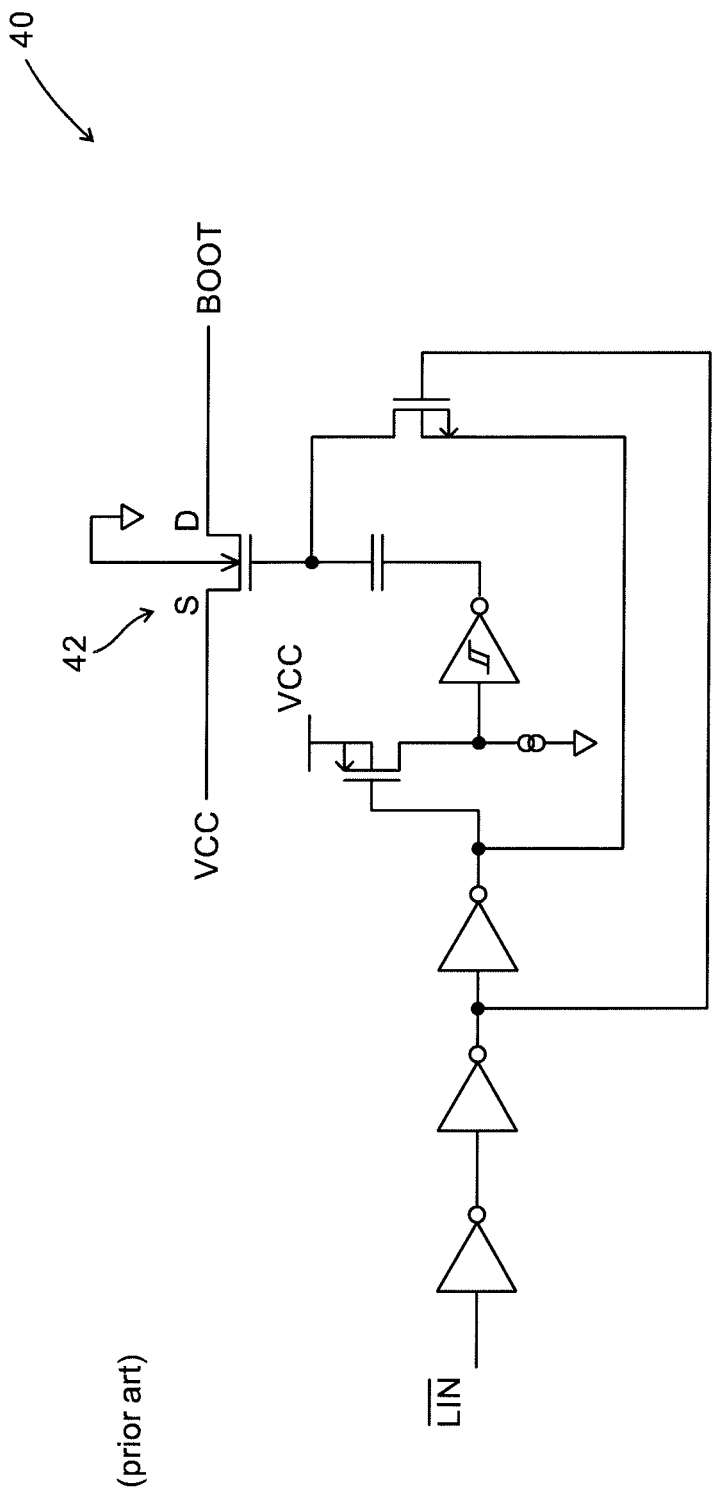
FIG. 2 is a circuit diagram of a typical high voltage emulated diode circuit.

By using the medium voltage PMOS device 506, unlike the known circuit in FIG. 2, no internal bootstrap gate driver circuit for controlling the gate terminal of the emulated diode is required.

Figure 6:
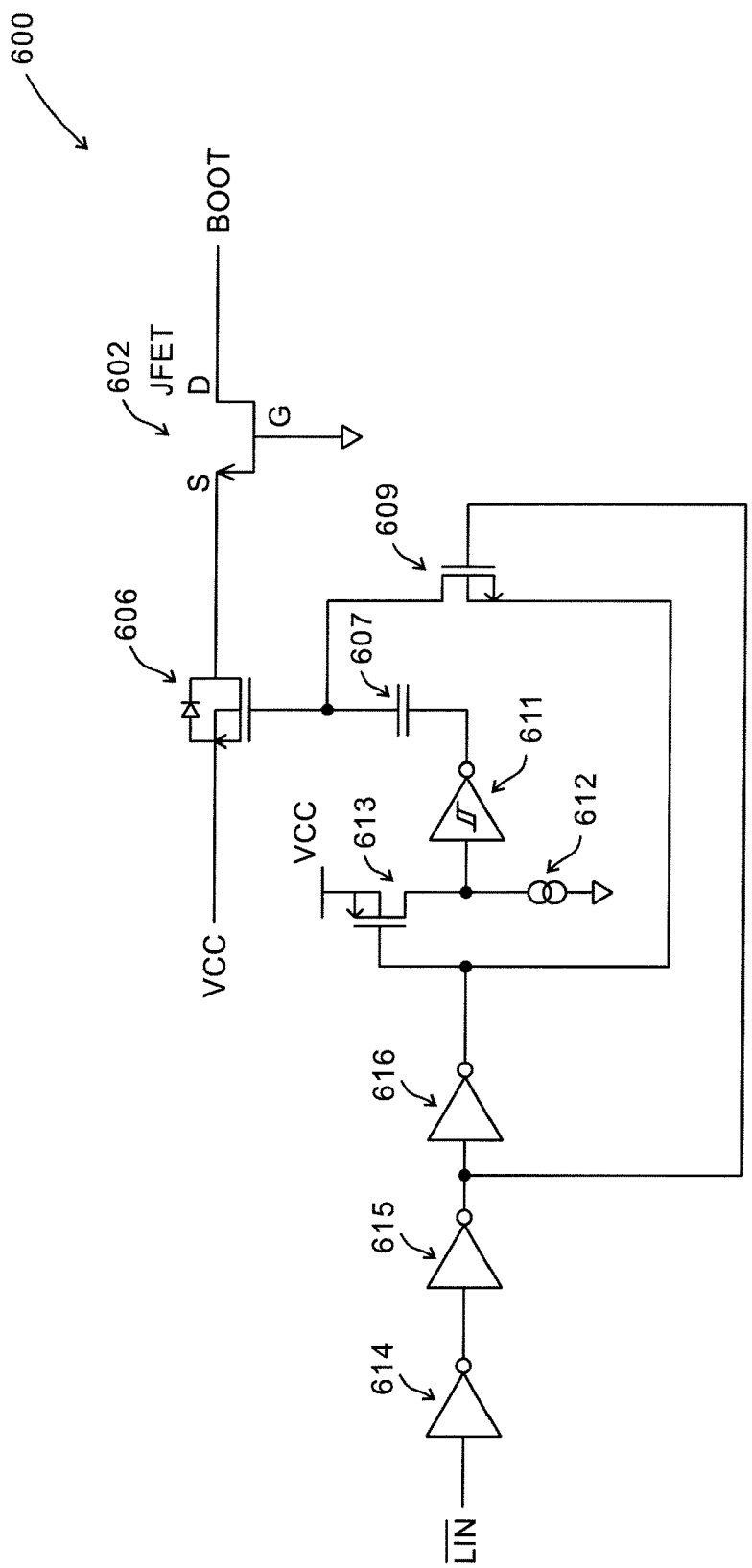
FIG. 6 is circuit diagram of a specific implementation of the bootstrap diode emulator circuit of FIG. 3 in one embodiment of the invention.

FIG. 6 shows another specific implementation of the bootstrap diode emulator circuit 300 of FIG. 3 in one embodiment of the invention. In the circuit 600 of FIG. 6, the switching device 306 in FIG. 3 is implemented with a medium voltage NMOS device 606 with a body diode connected between its source and drain terminals. The source terminal of the NMOS device 606 is connected directly with the node VCC. A gate control circuit similar to that illustrated in FIG. 2 is connected to the gate terminal of the NMOS device 606. The gate control circuit includes a capacitor 607 connected to the gate terminal of the NMOS device 606. 'The output of Schmidt triggered input inverter 611 is connected in series with the capacitor 607. A PMOS device 613 and a current source 612 are connected between nodes VCC and COM (or ground). The drain terminal of the PMOS device 613 is connected to both an input of the inverter 611 and to the current source 612. Three inverters 614-616 are arranged between the $\overline{\text{LIN}}$ input and the gate terminal of the PMOS device 613. A NMOS device 609 is arranged between the NMOS device 606 and a node between the inverters 615, 616. In particular, the drain terminal of the NMOS device 609 is connected to the gate terminal of the NMOS device 606 and to the capacitor 607. The gate terminal of the NMOS device 609 is connected to the node between inverters 615, 616. The source terminal of the NMOS device 609 is connected to the gate terminal of the PMOS device 613 and to the output of the inverter 616.

In operation of the circuit 600 of FIG. 6, due to the existence of the body diode between the source and drain terminals of the NMOS device 606, when voltage at node BOOT is more than a diode drop below voltage at node VCC, current can still pass from node VCC to node BOOT (in the same way as if an external bootstrap diode is present).

When the $\overline{\text{LIN}}$ input signal changes from high to low (i.e. with the low side driver on and hence OUT=zero V), due to the slow low-to-high delay created by the PMOS device 613, the current source 612, and the inverter 611, the capacitor 607 will be charged up to a diode drop below voltage at node VCC via the NMOS device 609.

When signal at the output of inverter 611 changes from low to high, the gate voltage of the NMOS device 606 is bootstrapped to nearly double of the voltage at node VCC (i.e. VCC×2), which provides sufficient gate-source voltage VGS for fully turning on the NMOS device 606 to thereby provide an additional low resistance charging path for the voltage at node VCC to charge the node BOOT. When signal at input $\overline{\text{LIN}}$ changes from low to high (i.e. with low side driver off), charge stored at capacitor 607 is discharged via NMOS device 609. The gate voltage at the NMOS device 606 becomes zero and the NMOS device 606 is turned off.

Figure 7:
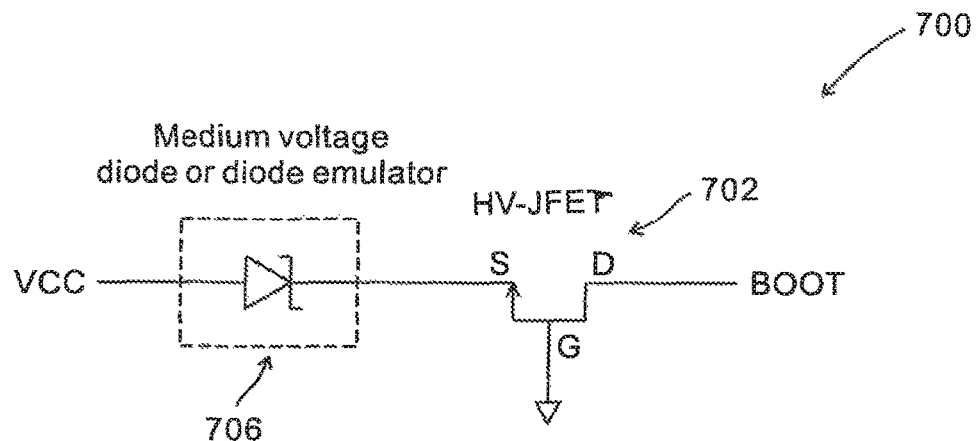
FIG. 7 is schematic circuit diagram of a bootstrap diode emulator circuit in one embodiment of the invention.

FIG. 7 shows a bootstrap diode emulator circuit 700 in another embodiment of the invention. The circuit 700 generally includes a transistor device 702 and a diodic device 706. The transistor device 702 is a high voltage JFET device. A source terminal of the JFET device 702 is connected with the diodic device 706; a gate terminal of the JFET device 702 is connected to ground; a drain terminal of the JFET device 702 is connected to bootstrap supply voltage node BOOT. The diodic device 706 can be a medium voltage diode as shown, or alternatively be a medium voltage diode emulator circuit (not shown). The minimum reverse breakdown voltage of the medium voltage diodic device 706 is larger than the difference between magnitude of the pinch off voltage of the JFET device 702 and the minimum voltage at node VCC. As shown in FIG. 7, the medium voltage diode is connected at its anode with node VCC and at its cathode with the source terminal of the high voltage JFET device 702.

In operation, when node BOOT is at high voltage, the high voltage JFET device 702 withstands the high voltage so that the maximum voltage at its source terminal is the magnitude of its pinch off voltage. Hence, the medium voltage diode (or diode emulator) 706 will withstand a maximum of the voltage difference between magnitude of pinch off voltage of the high voltage JFET device 702 and VCC. When voltage at node BOOT is lower than voltage at node VCC, charging current can flow from node VCC via the medium voltage diode (or diode emulator) 706 and hence via the high voltage JFET device 702 to node BOOT. The bootstrap diode emulator circuit 700 in the present embodiment eliminates the need of control using the low side control input signal $\overline{\text{LIN}}$, thereby enabling the emulated bootstrap diode to function in the same way as an external bootstrap diode.

Figure 8:
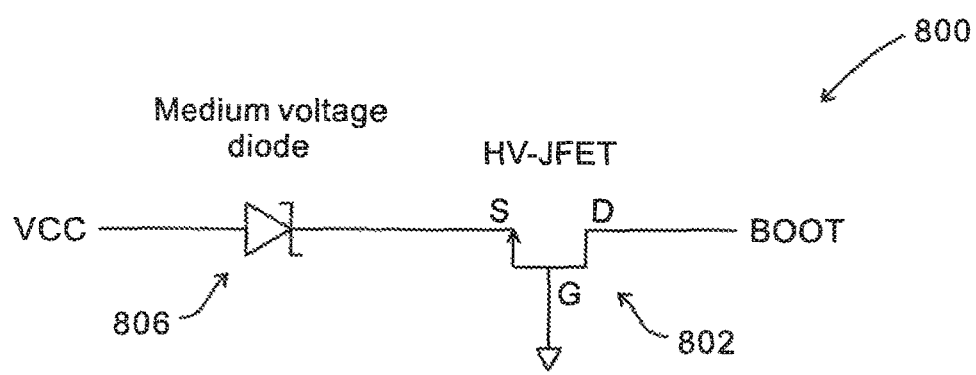
FIG. 8 is circuit diagram of a specific implementation of the bootstrap diode emulator circuit of FIG. 7 in one embodiment of the invention.

FIG. 8 shows a specific implementation of the bootstrap diode emulator circuit 700 of FIG. 7 in one embodiment of the invention. In the circuit 800 of FIG. 8, the device 806 is a medium voltage diode. As described, the minimum reverse breakdown voltage of the medium voltage diode 806 is larger than the difference between magnitude of the pinch off voltage of the high voltage JFET device 802 and the minimum voltage at node VCC.

FIGS. 9A to 9D show four other exemplary implementations of the bootstrap diode emulator circuit 700 of FIG. 7.

Figure 9A:
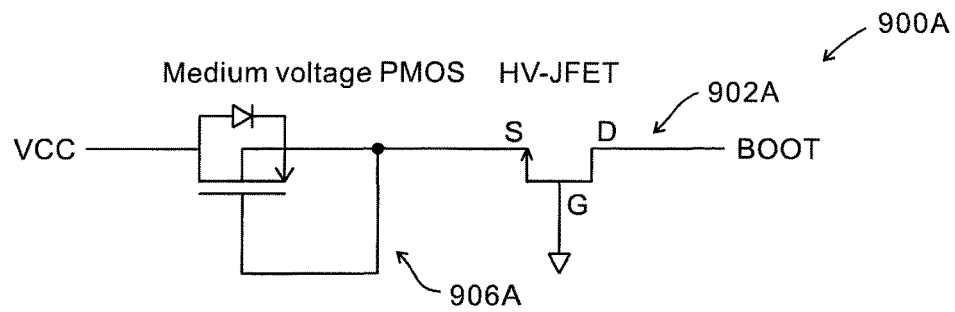
FIG. 9A is circuit diagram of a specific implementation of the bootstrap diode emulator circuit of FIG. 7 in one embodiment of the invention.

In the circuit 900A of FIG. 9A, the medium voltage emulated diode device is formed by a PMOS device 906A with a body diode connected between its source and drain terminals. The gate and source terminals of the PMOS device 906A are connected directly with each other. This embodiment is similar to that of FIG. 5 except all gate control circuits of the PMOS device 506 in FIG. 5 are removed and the gate and source terminals of the PMOS device 506 are connected directly with each other without using a resistor. The PMOS device 906A is connected with the high voltage JFET device 902A.

Figure 9B:
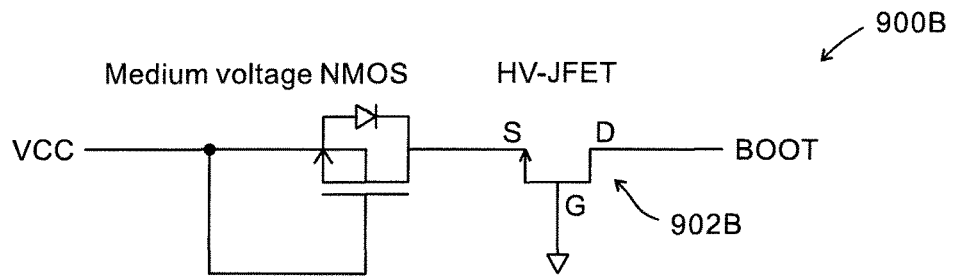
FIG. 9B is circuit diagram of a specific implementation of the bootstrap diode emulator circuit of FIG. 7 in one embodiment of the invention.

In the circuit 900B of FIG. 9B, the medium voltage emulated diode device is formed by a NMOS device 906B with a body diode connected between its source and drain terminals. The gate and source terminals of the NMOS device 906B are connected directly with each other. This embodiment is similar to that of FIG. 6 except all gate control circuits of the NMOS device 606 in FIG. 6 are removed and the gate and source terminals of the NMOS device 606 are connected directly with each other. The NMOS device 906B is connected with the high voltage JFET device 902B.

Figure 9C:
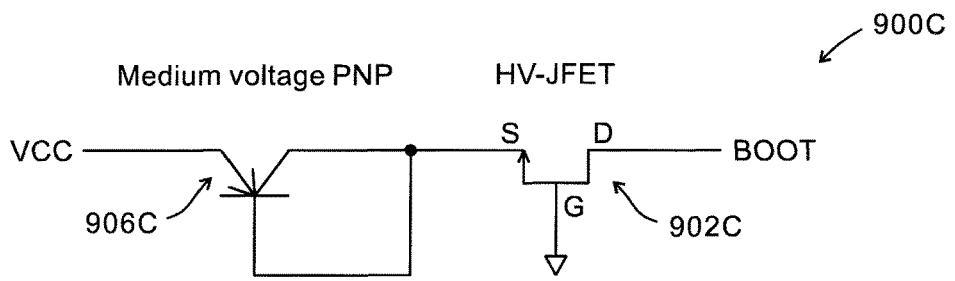
FIG. 9C is circuit diagram of a specific implementation of the bootstrap diode emulator circuit of FIG. 7 in one embodiment of the invention.
Figure 9D:
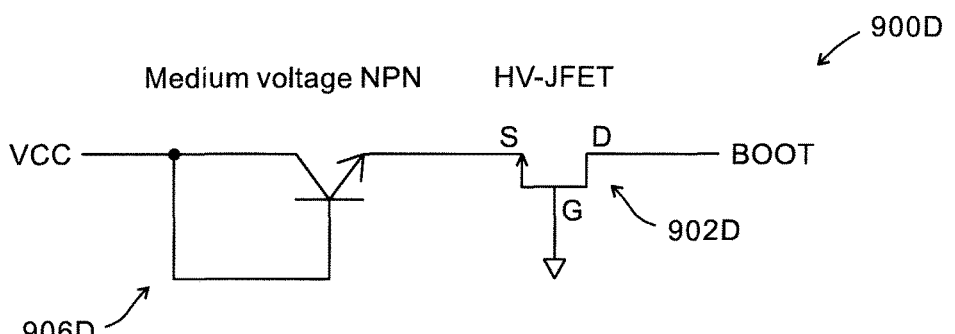
FIG. 9D is circuit diagram of a specific implementation of the bootstrap diode emulator circuit of FIG. 7 in one embodiment of the invention.

In the circuits 900C, 900D of FIG. 9C and 9D, the medium voltage emulated diode device is formed by a diode-connected bipolar transistor. In the circuit 900C of FIG. 9C, the medium voltage emulated diode device is a PNP bipolar transistor 906C with its base and collector terminals connected directly with each other. The PNP bipolar transistor 906C is connected with the high voltage JFET device 902C. In the circuit 900D of FIG. 9D, the medium voltage emulated diode device is a NPN bipolar transistor 906D with its base and collector terminals connected directly with each other. The NPN bipolar transistor 906D is connected with the high voltage JFET device 902D.

It will be appreciated by persons skilled in the art that numerous variations and/or modifications may be made to the invention as shown in the specific embodiments without departing from the spirit or scope of the invention as broadly described. For example, the JFET device in the circuit can be replaced with other types of transistor device (or semiconductor switches) that have a magnitude of a threshold voltage below which the transistor device is turned-off, and such magnitude is larger than a maximum voltage at the input node VCC. The diodic device may be implemented with other types of diodes or transistor device (or semiconductor switches) that preferably has a minimum reverse breakdown voltage larger than a difference between the magnitude of the threshold voltage and the minimum voltage at node VCC. The present embodiments are, therefore, to be considered in all respects as illustrative and not restrictive.

The invention claimed is:

1. A bootstrap diode emulator circuit having an anode and a cathode, wherein the bootstrap diode emulator circuit comprises:
  a transistor device providing the cathode of the bootstrap diode emulator circuit, wherein
    the transistor device is a JFET device having a pinch-off voltage below which the JFET device is turned off, and
    the pinch-off voltage of the JFET device is larger in magnitude than a maximum voltage received at the anode of the bootstrap diode emulator circuit; and
  a diodic device having
    a cathode connected to the transistor device, and
    an anode that is the anode of the bootstrap diode emulator circuit.

2. The bootstrap diode emulator circuit in accordance with claim 1, wherein the JFET device is a high-voltage device and the diodic device is a medium-voltage device.

3. The bootstrap diode emulator circuit in accordance with claim 1, wherein
  the anode of the bootstrap diode emulator circuit receives a minimum voltage, and
  the diodic device has a minimum reverse breakdown voltage that is larger in magnitude than the pinch-off voltage of the JFET device minus the minimum voltage received at the anode of the bootstrap diode emulator circuit.

4. The bootstrap diode emulator circuit in accordance with claim 1, wherein the JFET device has a gate terminal that is grounded.

5. The bootstrap diode emulator circuit in accordance with claim 1, wherein the JFET device has a source terminal that is connected directly to the diodic device.

6. The bootstrap diode emulator circuit in accordance with claim 1, wherein the diodic device includes a diode.

7. The bootstrap diode emulator circuit in accordance with claim 1, wherein the diodic device includes an emulated diode device.

8. The bootstrap diode emulator circuit in accordance with claim 7, wherein the emulated diode device comprises a semiconductor switch.

9. The bootstrap diode emulator circuit in accordance with claim 8, wherein the semiconductor switch comprises an NMOS device having drain and source terminals and including a body diode connected between the drain and source terminals.

10. The bootstrap diode emulator circuit in accordance with claim 9, wherein
  the NMOS device includes and gate terminal, and
  the gate and source terminals of the NMOS device are connected directly to each other.

11. The bootstrap diode emulator circuit in accordance with claim 10, further comprising a gate control circuit connected to the gate terminal of the NMOS device.

12. The bootstrap diode emulator circuit in accordance with claim 8, wherein the semiconductor switch comprises a diode-connected transistor.

13. The bootstrap diode emulator circuit in accordance with claim 12, wherein the diode-connected transistor comprises a PNP bipolar transistor having base and collector terminals and with the base and collector terminals connected directly to each other.

14. The bootstrap diode emulator circuit in accordance with claim 12, wherein the diode-connected transistor comprises a NPN bipolar transistor having base and collector terminals and with the base and collector terminals connected directly to each other.

15. The bootstrap diode emulator circuit in accordance with claim 7, wherein the emulated diode device comprises a PMOS device having drain and source terminals and including a body diode connected between the drain and source terminals.

16. The bootstrap diode emulator circuit in accordance with claim 15, wherein
  the PMOS device includes a gate terminal, and
  the gate and source terminals of the PMOS device are connected directly to each other.

17. The bootstrap diode emulator circuit in accordance with claim 15, wherein the PMOS device includes a gate terminal and further comprising a resistor connected between the gate and source terminals of the PMOS device.

18. A bootstrap diode emulator circuit having an anode and a cathode, wherein the bootstrap diode emulator circuit comprises:
  a transistor device providing the cathode of the bootstrap diode emulator circuit;
  a diodic device including an emulated diode device and having
    a cathode connected to the transistor device, and
    an anode that is the anode of the bootstrap diode emulator circuit, wherein the emulated diode device comprises a PMOS device having drain, source, and gate terminals and including a body diode connected between the drain and source terminals; and a resistor connected between the gate and source terminals of the PMOS device.

19. A bootstrap circuit comprising the bootstrap diode emulator circuit of claim 1 and a capacitor operably connected to the bootstrap diode emulator circuit.

20. An integrated circuit comprising the bootstrap diode emulator circuit of claim 1.

21. The bootstrap diode emulator circuit in accordance with claim 18, further comprising a gate control circuit connected to the gate terminal of the PMOS device.

22. An integrated circuit comprising the bootstrap diode emulator circuit of claim 18.

\* \* \* \* \*